(12) United States Patent
Krishnasamy et al.

(10) Patent No.: US 12,349,500 B2
(45) Date of Patent: Jul. 1, 2025

(54) PHOTODIODE WITH INSULATOR LAYER ALONG INTRINSIC REGION SIDEWALL

(71) Applicant: GlobalFoundries U.S. Inc., Malta, NY (US)

(72) Inventors: Rajendran Krishnasamy, Essex Junction, VT (US); John J. Ellis-Monaghan, Grand Isle, VT (US); Siva P. Adusumilli, South Burlington, VT (US); Ramsey M. Hazbun, Colchester, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 248 days.

(21) Appl. No.: 18/062,201

(22) Filed: Dec. 6, 2022

(65) Prior Publication Data
US 2024/0186429 A1    Jun. 6, 2024

(51) Int. Cl.
*H10F 77/20*        (2025.01)
*H10F 30/221*        (2025.01)
(Continued)

(52) U.S. Cl.
CPC ....... *H10F 77/206* (2025.01); *H10F 30/2218* (2025.01); *H10F 71/1215* (2025.01); *H10F 77/1227* (2025.01)

(58) Field of Classification Search
CPC ....... H01L 31/022408; H01L 31/03125; H01L 31/1037; H01L 31/1812; H01L 31/028;
(Continued)

(56) References Cited

U.S. PATENT DOCUMENTS

| 10,861,888 B2 | 12/2020 | Na et al. |
| 2006/0001043 A1 | 1/2006 | Shim |

(Continued)

FOREIGN PATENT DOCUMENTS

| EP | 4297092 A1 | 12/2023 |
| TW | 201424013 A | 6/2014 |

(Continued)

OTHER PUBLICATIONS

Nobukazu Teranishi, Effect and Limitation of Pinned Photodiode, IEEE Transactions on Electron Devices, Jan. 2016, vol. 63, No. 1, pp. 10-15.

(Continued)

*Primary Examiner* — Sitaramarao S Yechuri
(74) *Attorney, Agent, or Firm* — Francois Pagette; Hoffman Warnick LLC

(57) ABSTRACT

A photodiode and a related method of manufacture are disclosed. The photodiode includes a transfer gate and a floating diffusion adjacent to the transfer gate. In addition, the photodiode includes an upper terminal; an intrinsic semiconductor region in contact with the upper terminal, the intrinsic semiconductor region in a trench in a substrate adjacent to the transfer gate; and a lower terminal in contact with the intrinsic semiconductor region. An insulator layer is along an entirety of a sidewall of the intrinsic semiconductor region and between the intrinsic semiconductor region and the transfer gate. A p-type well may also optionally be between the insulator layer and the transfer gate.

18 Claims, 4 Drawing Sheets

(51) Int. Cl.
*H10F 71/00* (2025.01)
*H10F 77/1226* (2025.01)

(58) Field of Classification Search
CPC ........... H01L 31/035281; H01L 31/105; H01L 31/112; H01L 31/035272; H01L 27/14612; H01L 27/1446; H10F 77/206; H10F 77/1227; H10F 77/147; H10F 77/122; H10F 77/14; H10F 77/953; H10F 39/8037; H10F 39/107; H10F 39/8033; H10F 39/18; H10F 30/28; H10F 30/2218; H10F 30/221; H10F 30/223; H10F 71/1215; H10F 71/00
See application file for complete search history.

(56) References Cited

U.S. PATENT DOCUMENTS

| | | |
|---|---|---|
| 2009/0286345 A1 | 11/2009 | Cha |
| 2011/0037133 A1 | 2/2011 | Su et al. |
| 2014/0054736 A1* | 2/2014 | Meade ................. G02B 6/4201 438/69 |
| 2015/0325619 A1* | 11/2015 | Cheng ................. H10F 30/223 438/59 |
| 2018/0233521 A1 | 8/2018 | Na et al. |
| 2019/0312158 A1* | 10/2019 | Chen ................. H10F 39/8037 |
| 2021/0341619 A1* | 11/2021 | King ..................... G01S 17/894 |
| 2022/0115549 A1 | 4/2022 | Krishnasamy et al. |
| 2022/0310687 A1* | 9/2022 | Hsieh .................... H10F 39/014 |

FOREIGN PATENT DOCUMENTS

| | | |
|---|---|---|
| TW | 2016033519 A | 9/2016 |
| TW | 202118029 A | 5/2021 |
| TW | 202236656 A | 9/2022 |
| TW | 202238975 A | 10/2022 |

OTHER PUBLICATIONS

European Search Report for corresponding EP Application No. 23197836.2-1002 dated Mar. 15, 2024, 13 pages.
Office Action for Taiwan Application 112142611; pp. 10.
U.S. Appl. No. 17/664,741, filed May 24, 2022, entitled "Photodetector Structure With Insulative Collar and Related Methods".
U.S. Appl. No. 17/709,181, filed Mar. 30, 2022, entitled "Photodiodes".
Fossum et al., "A Review of the Pinned Photodiode for CCD and CMOS Image Sensors," IEEE Journal of the Electron Devices Society, 2:33-43, May 2014.
Korean Office Action for corresponding KR Application No. 10-2023-0151586 dated Jan. 23, 2025, 12 pages.
Taiwan Office Action for corresponding TW Application No. 112142611 dated Mar. 28, 2025, 3 pages.

* cited by examiner

PHOTODIODE WITH INSULATOR LAYER ALONG INTRINSIC REGION SIDEWALL

BACKGROUND

The present disclosure relates to photodetection and, more particularly, to a photodiode with an insulator layer along a sidewall of an intrinsic region, and a related method.

A photodiode is a semiconductor device that converts light into an electrical current. The current is generated when photons are absorbed in the photodiode. For example, when a photon of sufficient energy strikes the diode, it creates an electron-hole pair. This mechanism is also known as the photoelectric effect. The total current through the photodiode is the sum of the dark current and the photocurrent. Dark current is a small electric current that flows through photosensitive devices even when no photons are entering the device and is a primary source of noise in photonic sensors. Dark current, when present, may have negative effects on photodetector performance.

Infra-red photodetectors currently use expensive indium gallium arsenic (InGaAs) sensors. Silicon-based visible light sensors have developed the lowest noise solution using a photodiode in charged couple devices (CCD) and complementary metal-oxide semiconductor (CMOS) sensors. However, forming a lower noise, lower cost infra-red photodetector with adequate dark current suppression and quantum efficiency remains a challenge.

SUMMARY

All aspects, examples and features mentioned below can be combined in any technically possible way.

An aspect of the disclosure provides a photodiode, comprising: a transfer gate and a floating diffusion adjacent to the transfer gate; an upper terminal; an intrinsic semiconductor region in contact with the upper terminal, the intrinsic semiconductor region in a trench in a substrate adjacent to the transfer gate; a lower terminal in contact with the intrinsic semiconductor region; and an insulator layer along an entirety of a sidewall of the intrinsic semiconductor region and between the intrinsic semiconductor region and the transfer gate.

An aspect of the disclosure provides a photodiode, comprising: a transfer gate and a floating diffusion adjacent to the transfer gate; an upper terminal; an intrinsic semiconductor region in contact with the upper terminal, the intrinsic semiconductor region in a trench in a substrate adjacent to the transfer gate; a lower terminal in contact with the intrinsic semiconductor region; an insulator layer along a sidewall of the intrinsic semiconductor region and between the intrinsic semiconductor region and the transfer gate; and a first p-type well in the substrate between the insulator layer and the transfer gate.

An aspect of the disclosure provides a method comprising: forming a lower terminal in a substrate, the lower terminal including a first p-type well and an n-type well over the first p-type well; forming a trench into the substrate over the lower terminal; forming an insulator layer along a sidewall of the trench; forming an intrinsic semiconductor region in the trench in contact with the lower terminal, wherein the insulator layer contacts the intrinsic semiconductor region along an entirety of a vertical extent of the intrinsic semiconductor region; forming a transfer gate adjacent the intrinsic semiconductor region and a floating diffusion adjacent to the transfer gate, wherein the insulator layer is positioned between the intrinsic semiconductor region and the transfer gate; and forming an upper terminal in contact with the intrinsic semiconductor region.

Two or more aspects described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
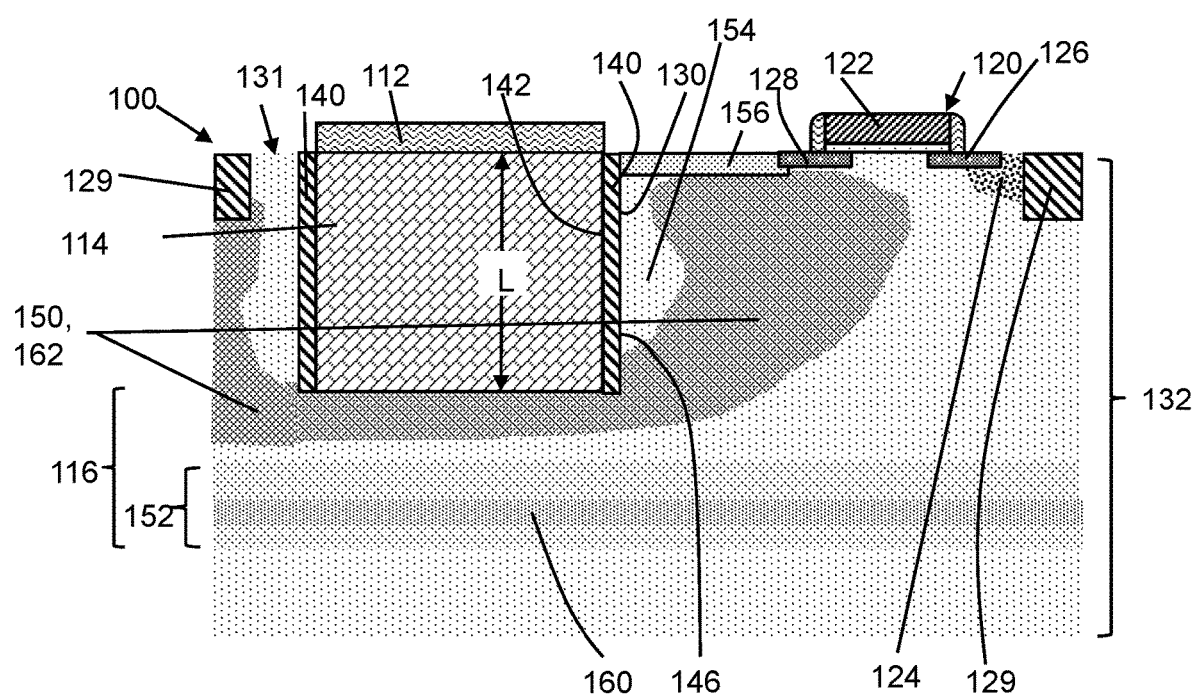
FIG. 1 shows a cross-sectional view of a photodiode and a transfer gate, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure relate to photodetection using photodiodes. More particularly, embodiments of the disclosure include a photodiode and a related method of manufacture. The photodiode may include a transfer gate and a floating diffusion adjacent to the transfer gate. In addition, the photodiode includes an upper terminal; an intrinsic semiconductor region in contact with the upper terminal, the intrinsic semiconductor region in a trench in a substrate adjacent to the transfer gate; and a lower terminal in contact with the intrinsic semiconductor region. An insulator layer is along an entirety of a sidewall of the intrinsic semiconductor region and between the intrinsic semiconductor region and the transfer gate. A p-type well may also optionally be between the insulator layer and the transfer gate. Advantageously, the photodiode provides improved performance, e.g., provides low noise and low dark current, compared to conventional photodiodes. Moreover, the photodiode can be easily integrated into a front-end-of-line (FEOL) process using known processes.

In more specific embodiments, the photodiode may include the intrinsic semiconductor region, with n-type and p-type wells at a bottom of the region and a heavily p-type (p+) doped semiconductor at a top of the region. In embodiments, the p+ semiconductor may be an upper terminal, and the n-type well and p-type well may be a lower terminal in contact with the intrinsic semiconductor region. The intrinsic semiconductor region may be any appropriate semiconductor material, e.g., germanium, depending on which wavelength of light is to be detected by the photodiode. Also, in embodiments, the n-type well may be fully depleted at a known bias. For example, to be fully depleted, the bottom p-well may have a doping charge higher than n-type well such that with an applied bias the n-type well can be fully depleted (resulting in the photodiode operation). The insulator layer provides further isolation to ensure full depletion. The additional p-type well between the insulation layer and the transfer gate may be provided to further ensure full depletion.

The photodiodes of the present disclosure can be manufactured in a number of ways using a number of different tools. In general, though, the methodologies and tools are used to form structures with dimensions in the micrometer and nanometer scale. The methodologies, i.e., technologies, employed to manufacture the photodiodes of the present disclosure have been adopted from integrated circuit (IC) technology. For example, the structures are built on wafers and are realized in films of material patterned by photolithographic processes on the top of a wafer. In particular, the fabrication of the photodiodes uses three basic processes: (i) deposition of thin films of material on a substrate, (ii) applying a patterned mask on top of the films by photolithographic imaging, and (iii) etching the films selectively to the mask.

Figure 2:
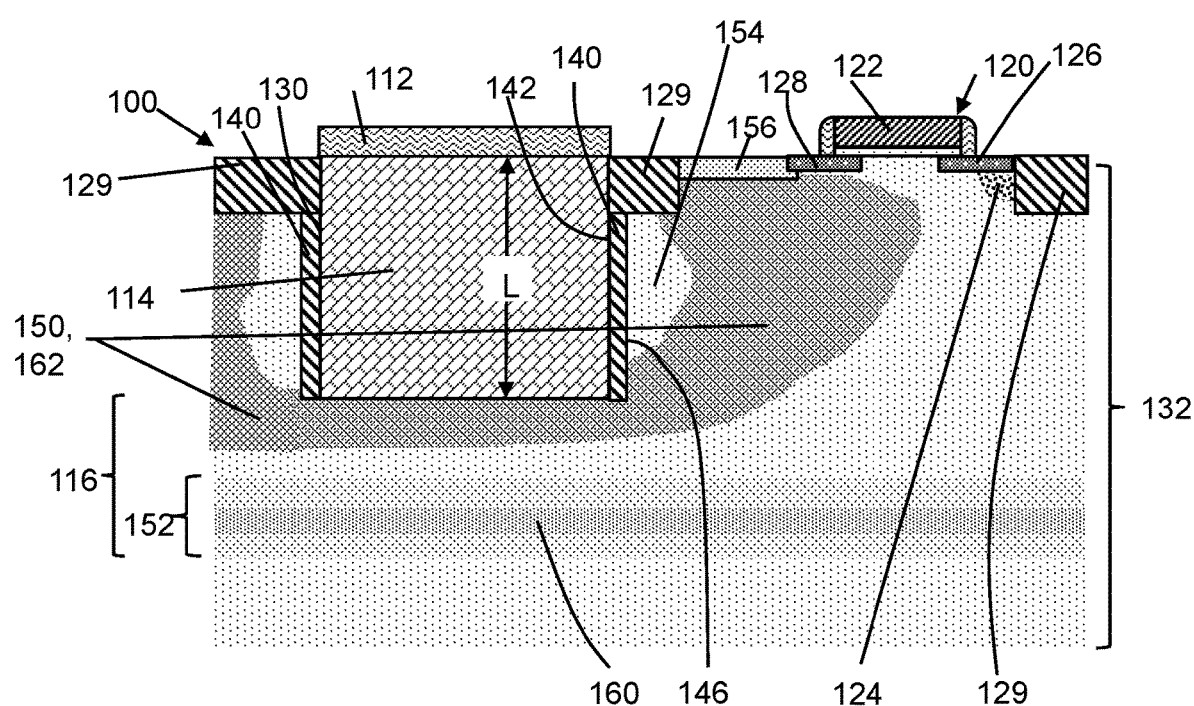
FIG. 2 shows a cross-sectional view of a photodiode and a transfer gate, according to other embodiments of the disclosure.

FIG. 1 shows a cross-sectional view of a photodiode 100 in accordance embodiments of the disclosure, and FIG. 2 shows a cross-sectional view of a photodiode 100 in accordance with other embodiments of the disclosure. In particular, photodiode 100 includes an upper terminal 112, an intrinsic semiconductor region 114 in contact with upper terminal 112, and a lower terminal 116 in contact with intrinsic semiconductor region 114. Photodiode 100 (hereafter "PD 100") may also include, i.e., be integrated with, a field effect transistor (FET) 120. Among other structures, FET 120 may include a transfer gate 122 and a floating diffusion 124. By including FET 120 integrated with or connected to PD 100, it is possible to read out the result of the detected light thereby providing a silicon pinned CMOS photodetector. In certain embodiments PD 100 may be a pinned photodiode, i.e., with p-type pinning layer 156. That is, photodiode 100 may include an integrated device having a pinned diode connection between FET 120 and the rest of PD 100. The pinned arrangement is not necessary in all cases.

In embodiments, PD 100 may be formed, at least in part, in a trench 130 of a substrate 132 used for FET 120 and perhaps other CMOS devices (not shown). FET 120 may be a conventional transistor formed by any known processes, e.g., gate first process or replacement gate process, with a transfer gate 122 adjacent a floating diffusion 124. FET 120 may also include a source region 126 (e.g., N+ region) and a pinned drain region 128 (e.g., P/N region), i.e., drain region 128 is in direct contact with n-type well 150. Although not shown, any variety of trench isolations 129 may be adjacent to floating diffusion 124 and/or drain region 126 (not shown, see FIG. 2), separating FET 120 from other structure in a known fashion. Substrate 132 may include any appropriate semiconductor material for CMOS technology, including but not limited to silicon. In certain embodiments, substrate 132 may be a p-type silicon semiconductor substrate.

Intrinsic semiconductor region 114 (hereafter "intrinsic region 114") is in trench 130 in substrate 132 in which photodiode 100 is formed. Intrinsic region 114 may include germanium for sensing infrared wavelengths, although other semiconductor materials are contemplated herein depending on the wavelength (or frequency) of light to be detected. As noted, germanium material may be used to detect infrared wavelengths, whereas indium gallium arsenide (InGaAs) may be used to detect shortwave infrared wavelengths. Trench 130 may be formed into substrate 132 over lower terminal 116, using any appropriate masking and etching processes in substrate 132. In FIG. 1, trench 130 is formed through an active region 131 of substrate 132, and in FIG. 2, trench 130 is formed through trench isolation 129. Intrinsic region 114 may be epitaxially grown in trench 130 over n-type well 150, described further herein. Hence, intrinsic region 114 may be formed in trench 130 in contact with lower terminal 116.

PD 100 also includes an insulator layer 140 along an entirety of a sidewall 142 of intrinsic region 114 and between intrinsic region 114 and transfer gate 122. Insulator layer 140 may include any appropriate dielectric material, such as but not limited to silicon oxide, for preventing electrical communication between upper terminal 112 and intrinsic region 114 and, among other structure, transfer gate 122. Insulator layer 140 may be formed along sidewall 146 of trench 130, for example, by depositing an insulator layer on trench 130 and, using any appropriate masking, carrying an etch back to remove the insulator layer from unwanted surfaces, e.g., the bottom of trench 130. In certain embodiments, insulator layer 140 extends along an entirety of a vertical extent L of sidewall 142 of trench 130 and intrinsic region 114. However, in certain embodiments, a lower end of insulator layer 140 may be allowed to be above a lower end of intrinsic region 114.

Lower terminal 116 is within substrate 132 shared with transfer gate 122. Lower terminal 116 may include an n-type well 150 and a lower p-type well 152 under n-type well 150. In certain embodiments, an upper p-type well 154 may also be provided between insulator layer 140 and transfer gate 122. In this case, n-type well 150 extends between upper p-type well 154 and transfer gate 122. In embodiments, both n-type well 150 and p-type wells 152, 154 may be silicon. In certain embodiments, upper p-type well 154 may also include an upper p-type well portion 156 (illustrated with box for clarity) that extends over n-type well 150 between insulator layer 140 and transfer gate 122. As noted, transfer gate 122 includes source region 126 and drain region 128, and drain region 128 is in direct contact with n-type well 150, i.e., drain region 128 is pinned to n-type well 150.

In embodiments, lower p-type well 152 may include a heavily doped p-type region 160, and n-type well 150 may include lighter doped n-type region 162. In embodiments, n-type well 150 and lower p-type well 152 may be formed underneath and/or to the side of trench 130 within substrate 132. It should be understood by those of skill in the art that heavily doped lower p-type well 152 and lighter doped n-type well 150 may be representative of bottom terminal 116 of PD 100. N-type well 150 may extend to and contact an underside of drain region 128. The connection between n-type well 150 and drain region 128 forms a pinned connection between the rest of PD 100 and FET 120.

Lower terminal 116 may be formed in substrate 132 by doping of substrate 132. That is, lower p-type well 152 and n-type well 150 over lower p-type well 152 may be formed by doping of substrate 132. Upper p-type well 154, where provided, may also be formed by doping substrate 132. Any doped regions off PD 100, e.g., floating diffusion 124 (n-type as shown), source region 126 (e.g., N+ region), drain region 128 (e.g., P/N region), upper p-type well 154, lower p-type well 152 and n-type well 150 may be formed by introducing a dopant using, for example, ion implantation that introduces a concentration of a dopant in substrate 132 (prior to trench 130 formation). The doped regions may be formed by introducing a concentration of an appropriate dopant conductivity type in substrate 132. In embodiments, respective patterned implantation masks may be used to define selected areas exposed for the implantations. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The p-type dopants may be, e.g., boron (B), and the n-type dopants may be, e.g., arsenic (As), phosphorus (P) and/or antimony (Sb), among other suitable examples.

In certain embodiments, lower and upper p-type wells 152, 154 may be doped with p-type dopants, e.g., boron of about $1E17/cm^3$ to $E20/cm^3$ dopant level, and n-type well 150 may be doped with n-type dopants, e.g., arsenic, phosphorous, antimony, etc., of about $1E17/cm^3$ to $E20/cm^3$ dopant level. For example, n-type well 150 may include phosphorus doped silicon, and lower and upper p-type wells 152, 154 may include boron doped silicon (and, as noted, intrinsic region may include germanium). In further embodiments, n-type well 150 may be doped at a lower concentration than p-type wells 152, 154, e.g., in an n region nominally about $1E17/cm^3$ and in a p region nominally about $1E18/cm^3$. In this way, upon application of an applied voltage in an on-state of transfer gate 122, lower terminal 116 is fully depleted. More particularly, n-type well 150 may become fully depleted (i.e., resulting in a pinned photodiode operation), which provides the advantage of low noise and low dark current. It should also be understood by those of skill in the art that the doping level of n-type well 150 may be adjusted depending on the applied voltage bias. For example, a photodiode designed for a 5V bias would have a higher doping of n-type well 150 than for a 0.5V bias. In embodiments, the higher bias results in more depletion for the same dopant concentration, thus if designed for a higher bias, it is possible to use a higher dopant concentration.

Upper terminal 112 is in contact with intrinsic region 114. Upper terminal 112 may include a p-type doped semiconductor. In certain embodiments, upper terminal 112 may include a heavily p-type doped polysilicon, e.g., $1E18/cm^3$ to $5E21/cm^3$. In embodiments, upper terminal 112 may be formed by an epitaxial growth process and may comprise a polysilicon material. More particularly, upper terminal 112 may be epitaxially grown on intrinsic region 114, e.g., with an in-situ doping process. In embodiments, an oxide or other hardmask material may be used to block the epitaxial growth of the P+ semiconductor material and intrinsic region 114 over parts of FET 120, e.g., source region 126 (e.g., N+ region), drain region 128 (e.g., P/N region) and transfer gate 122. The oxide or other hardmask material may be removed by a conventional etching process after formation of upper terminal 112 and intrinsic region 114.

Figure 3:
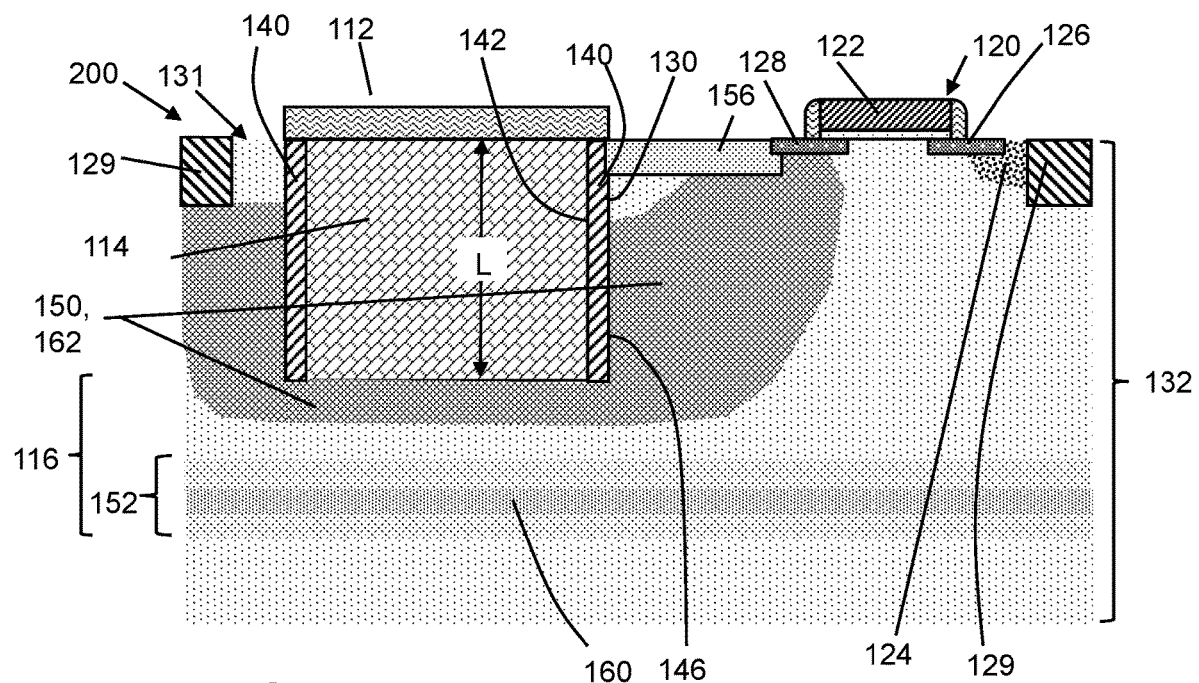
FIG. 3 shows a cross-sectional view of a photodiode and a transfer gate, according to embodiments of the disclosure.
Figure 4:
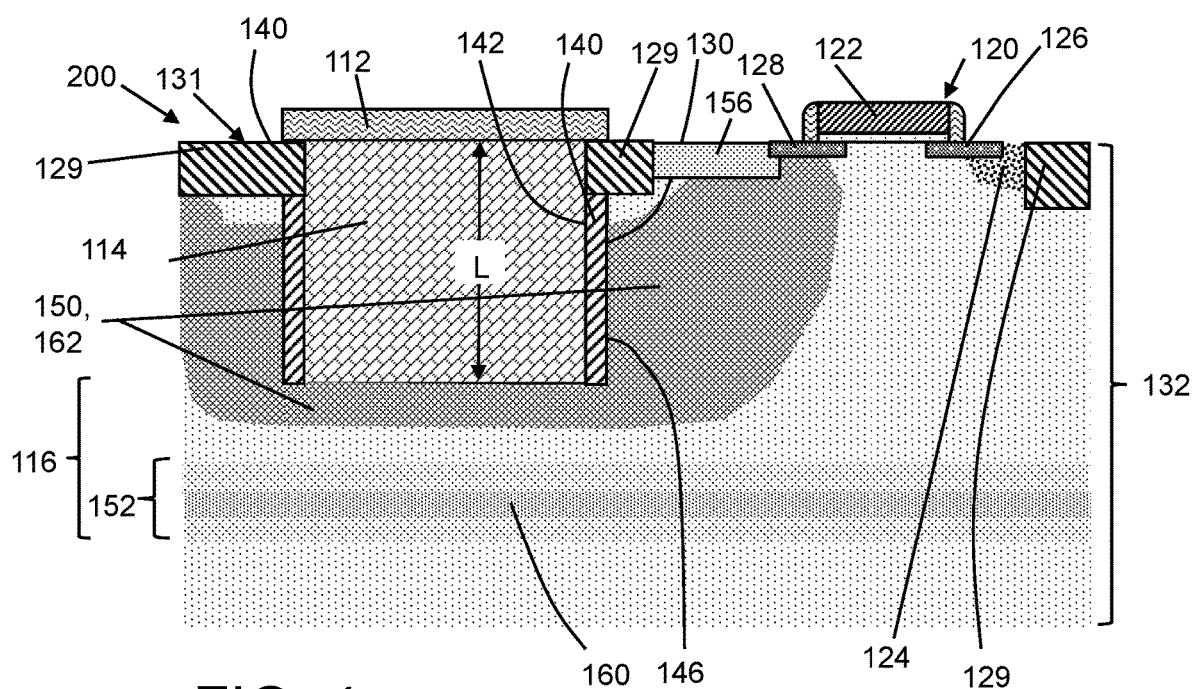
FIG. 4 shows a cross-sectional view of a photodiode and a transfer gate, according to other embodiments of the disclosure.

FIG. 3 shows a cross-sectional view of a PD 200, according to other embodiments of the disclosure, and FIG. 4 shows a cross-sectional view of PD 200 in accordance with yet other embodiments of the present disclosure. PD 200 in FIG. 3 is identical to PD 100 in FIG. 1, except upper p-well 154 is omitted, and PD 200 in FIG. 4 is identical to PD 100 in FIG. 2, except upper p-well 154 is omitted. More particularly, the doping used to create upper p-well 154 in contact with insulator layer 140 is omitted. Hence, lower terminal 116 includes n-type well 150 and lower p-type well 152 under n-type well 150, and n-type well 150 extends between insulator layer 140 and transfer gate 122. In contrast to FIGS. 1 and 2, n-type well 150 contacts insulator layer 140. Upper p-type well portion 156 may still exist over n-type well 150 between insulator layer 140 and transfer gate 122. In FIG. 3, trench 130 is formed through active region 131 of substrate 132, and in FIG. 4, trench 130 is formed through trench isolation 129.

In operation, a voltage bias, e.g., 0V, is applied to upper terminal 112 and a positive bias (e.g., 1-3V) is applied to lower terminal 116. Any form of electrical contacts (not shown) can be provided to apply the desired biases. The voltages will fully deplete n-type well 150. Insulator layer 140 improves the ability of the applied bias to fully deplete a middle section of n-type well 150 (between drain 128 and under intrinsic region 114), which can be challenging without such structure. Notably, insulator layer 140 prevents carriers from going from intrinsic region 114 to transfer gate 122, forcing them through n-type well 150. Insulating layer 140 thus reduces dark current while enabling connection of n-type well 150 and transfer gate 122. Where provided, upper p-type well 154 also makes the depletion of the middle section of n-type well 150 easier by more precisely directing carriers toward transfer gate 122.

Once fully depleted, transfer gate 122 is turned off and PD 100, 200 may then be exposed to light, which generates electron hole pairs in intrinsic region 114. N-type well 150 can then detect the electron hole pairs, at which time n-type well 152 may no longer be fully depleted. For example, the electron carriers will be attracted to the fully depleted potential of n-type well 150 which will accumulate until FET 120, i.e., transfer gate 122, is turned on (brought high) again for a readout. In other words, when transfer gate 122 is turned on, the electronic carriers will be pulled out of n-type well 150 to floating diffusion 124 of FET 120—they are read out by transfer gate 122. When transfer gate 122 is turned off after the electron carriers have been pulled out (by applying an appropriate bias (e.g., 2-3V on drain region 128)), n-type well 150 will again be fully depleted resulting in no charges in the n-type well.

It should be recognized by those of skill in the art that the polarities described herein (e.g., n-type or p-type) of the components can be flipped and still provide the same advantages and benefits described herein. For example, an NFET can be a PFET, with the n diffusions becoming p diffusions and the p diffusions becoming n diffusions.

Embodiments of the disclosure provide various technical and commercial advantages, examples of which are discussed herein. PD 100, 200 provides low noise and low dark current and good quantum efficiency. In addition, PDs 100, 200 are easy to integrate into a FEOL process module using known processes. Where intrinsic region 114 uses Ge instead of InGaAs, PDs 100, 200 have a much lower cost infrared sensor than current products.

The structure and method as described above are used in the fabrication of photonic integrated circuit chips. The resulting photonic integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed:

1. A photodiode, comprising:
   a transfer gate and a floating diffusion adjacent to the transfer gate;
   an upper terminal;
   an intrinsic semiconductor region in contact with the upper terminal, the intrinsic semiconductor region in a trench in a substrate adjacent to the transfer gate;
   a lower terminal in contact with the intrinsic semiconductor region and including an n-type well and a second p-type well under the n-type well;
   an insulator layer along an entirety of a sidewall of the intrinsic semiconductor region and between the intrinsic semiconductor region and the transfer gate; and
   a first p-type well between the insulator layer and the transfer gate, wherein the n-type well extends between the first p-type well and the transfer gate.

2. The photodiode of claim 1, wherein the first p-type well also extends over the n-type well between the insulator layer and the transfer gate.

3. The photodiode of claim 1, wherein the transfer gate includes a source region and a drain region, the drain region in direct contact with the n-type well.

4. The photodiode of claim 1, wherein, in an on-state of the transfer gate, the lower terminal and the first p-type well are fully depleted.

5. The photodiode of claim 1, wherein an n-type well includes phosphorus doped silicon, the first p-type well includes boron doped silicon, and the intrinsic semiconductor region includes germanium.

6. The photodiode of claim 1, wherein the upper terminal includes a p-type doped semiconductor and the lower terminal includes an n-type well and a first p-type well under the n-type well, wherein the n-type well extends between the insulator layer and the transfer gate and contacts the insulator layer.

7. The photodiode of claim 6, further comprising a second p-type well over the n-type well between the insulator layer and the transfer gate.

8. The photodiode of claim 1, wherein the upper terminal includes a heavily p-type doped polysilicon.

9. The photodiode of claim 1, wherein the lower terminal is within the substrate shared with the transfer gate.

10. A method comprising:
    forming a lower terminal in a substrate, the lower terminal including a first p-type well and an n-type well over the first p-type well;
    forming a trench into the substrate over the lower terminal;
    forming an intrinsic semiconductor region in the trench in contact with the lower terminal, wherein the insulator layer contacts the intrinsic semiconductor region along an entirety of a vertical extent of the intrinsic semiconductor region;
    forming an insulator layer along a sidewall of the intrinsic semiconductor region;
    forming a second p-type well in the substrate between the insulator layer and a transfer gate, wherein the n-type well extends between the first p-type well and the transfer gate;
    forming a transfer gate adjacent the intrinsic semiconductor region and a floating diffusion adjacent to the transfer gate, wherein the insulator layer is positioned between the intrinsic semiconductor region and the transfer gate; and
    forming an upper terminal in contact with the intrinsic semiconductor region.

11. The method of claim 10, wherein the first p-type well also extends over the n-type well between the insulator layer and the transfer gate.

12. The method of claim 10, wherein the transfer gate includes a source region and a drain region, the drain region in direct contact with the n-type well.

13. The method of claim 10, wherein, in an on-state of the transfer gate, the lower terminal and the first p-type well are fully depleted.

14. The method of claim 10, wherein an n-type well includes phosphorus doped silicon, the first p-type well includes boron doped silicon, and the intrinsic semiconductor region includes germanium.

15. The method of claim 10, wherein the upper terminal includes a p-type doped semiconductor and the lower terminal includes an n-type well and a first p-type well under the n-type well, wherein the n-type well extends between the insulator layer and the transfer gate and contacts the insulator layer.

16. The method of claim 15, further comprising forming a second p-type well over the n-type well between the insulator layer and the transfer gate.

17. The method of claim 10, wherein the upper terminal includes a heavily p-type doped polysilicon.

18. The method of claim 10, wherein the lower terminal is within the substrate shared with the transfer gate.

* * * * *